United States Patent
Thamma et al.

(10) Patent No.: US 11,656,261 B2
(45) Date of Patent: May 23, 2023

(54) ELECTROSTATIC DETECTIONS

(71) Applicant: Hewlett-Packard Development Company, L.P., Spring, TX (US)

(72) Inventors: Nick Thamma, Houston, TX (US); Pei Hsuan Li, Taipei (TW); Sze Hau Loh, Cypress, TX (US)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 71 days.

(21) Appl. No.: 17/386,411

(22) Filed: Jul. 27, 2021

(65) Prior Publication Data

US 2023/0035435 A1    Feb. 2, 2023

(51) Int. Cl.
*G01R 29/14* (2006.01)
*G01R 29/24* (2006.01)
*H05K 1/11* (2006.01)
*G06F 3/01* (2006.01)

(52) U.S. Cl.
CPC ............. *G01R 29/14* (2013.01); *G01R 29/24* (2013.01); *G06F 3/011* (2013.01); *H05K 1/115* (2013.01); *H05K 2201/10151* (2013.01)

(58) Field of Classification Search
CPC ......... G01R 29/14; G01R 29/24; G06F 3/011; H05K 1/115; H05K 2201/10151
USPC ........................................................ 324/457
See application file for complete search history.

(56) References Cited

U.S. PATENT DOCUMENTS

| 4,724,393 A | 2/1988 | Kumada |
| 5,019,804 A | 5/1991 | Fraden |
| 8,390,303 B2 | 3/2013 | Fang |
| 9,354,264 B2 * | 5/2016 | Schwartz ........... G01R 27/2605 |
| 2008/0129302 A1 | 6/2008 | Shafai |

OTHER PUBLICATIONS

IOT Sensor Week.

* cited by examiner

*Primary Examiner* — Farhana A Hoque
(74) *Attorney, Agent, or Firm* — Knobbe, Martens, Olson & Bear, LLP

(57) ABSTRACT

In some examples, an electronic device includes a printed circuit board. In some examples, the printed circuit board includes a conductive base layer. In some examples, the conductive base layer is an electrode to produce a signal indicative of a change in an omnidirectional electrostatic field corresponding to a moving object. In some examples, the printed circuit board includes a via coupled to the conductive base layer. In some examples, the via is disposed through an intermediate layer of the printed circuit board. In some examples, the printed circuit board includes an integrated circuit coupled to the via. In some examples, the integrated circuit is to detect, using a machine learning model, a direction of the moving object in the omnidirectional electrostatic field based on a feature of the signal.

15 Claims, 6 Drawing Sheets

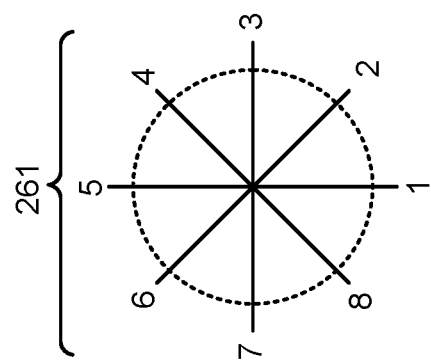
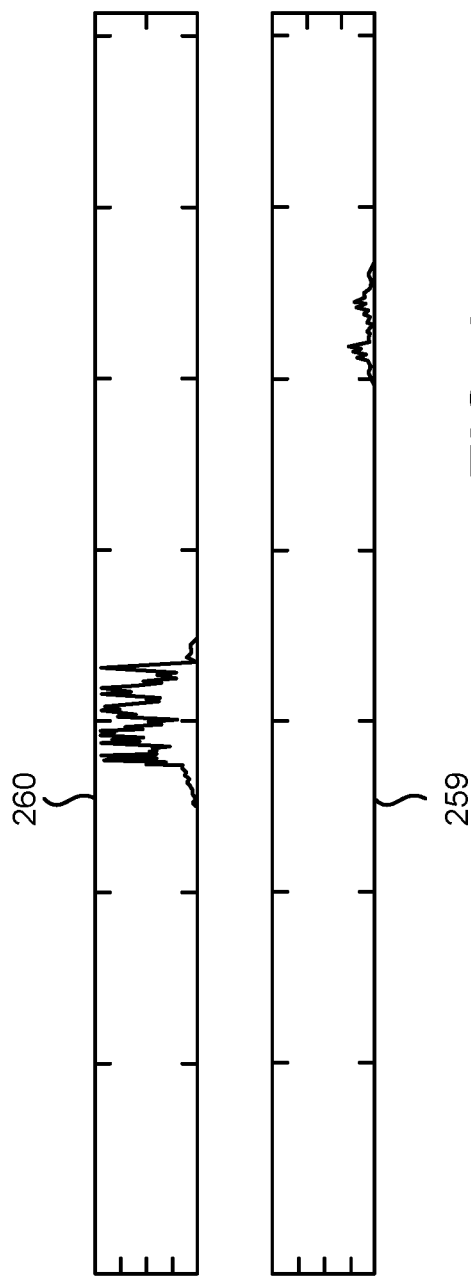
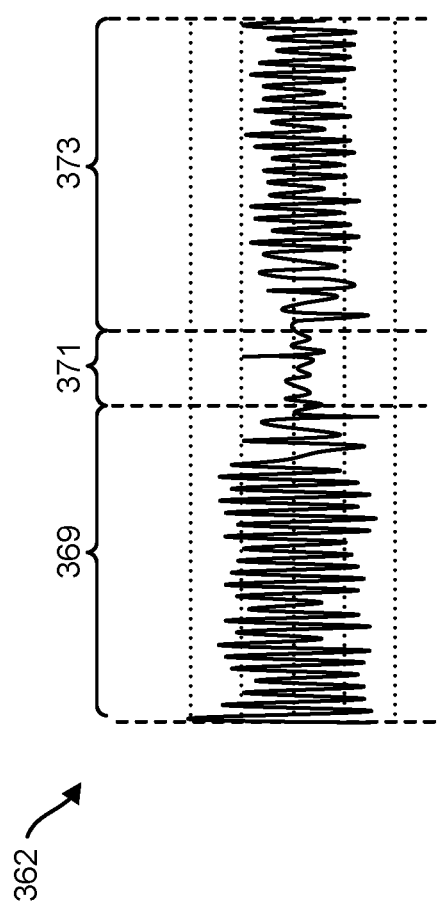

US 11,656,261 B2

ELECTROSTATIC DETECTIONS

BACKGROUND

Electronic technology has advanced to become virtually ubiquitous in society and has been used for many activities in society. For example, electronic devices are used to perform a variety of tasks, including work activities, communication, research, and entertainment. Different varieties of electronic circuitry may be utilized to provide different varieties of electronic technology.

BRIEF DESCRIPTION OF THE DRAWINGS

FIG. 2 is a diagram illustrating examples of signals that may be indicative of changes in an omnidirectional electrostatic field corresponding to a moving object;
FIG. 3 is a diagram illustrating an example of a plot of a signal that may be indicative of changes in an omnidirectional electrostatic field.

DETAILED DESCRIPTION

Figure 1:
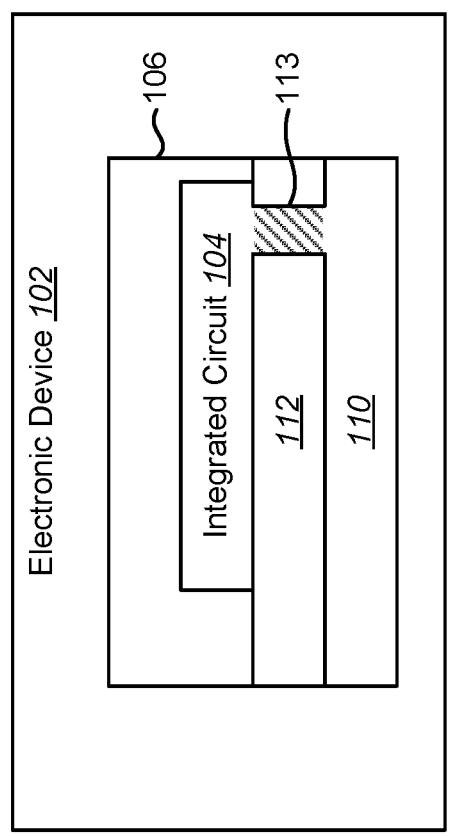
FIG. 1 is a block diagram illustrating an example of an electronic device that may be used to provide electrostatic detection.

Presence detection and scenario (e.g., activity, event, setting) classification may be useful in context-aware applications. Some examples of the techniques described herein provide approaches for detecting human presence and activities. For instance, some of the techniques may utilize an electrode to sense electrostatic field variations (e.g., electric charge variation) to detect people and their activities near an electronic device. Some of the techniques may detect the presence of humans, the activities they perform, and may be able to distinguish locations (e.g., a person in front of a laptop and others in the environment). For example, an electronic device may detect a human location within a range based on electrostatic field variations sensed by an electrode.

Throughout the drawings, similar reference numbers may designate similar or identical elements. When an element is referred to without a reference number, this may refer to the element generally, with or without limitation to any particular drawing or figure. In some examples, the drawings are not to scale, and the size of some parts may be exaggerated to more clearly illustrate the example shown. Moreover, the drawings provide examples in accordance with the description. However, the description is not limited to the examples provided in the drawings.

FIG. 1 is a block diagram illustrating an example of an electronic device 102 that may be used to provide electrostatic detection. An electronic device may be a device that includes electronic circuitry. Examples of the electronic device 102 may include a computer (e.g., laptop computer, desktop computer, etc.), a smartphone, mobile phone, a tablet computer, mobile device, camera, headphones, headset (e.g., virtual reality (VR) headset, augmented reality (AR) headset, etc.), monitor, television, point of sale, wearable device, conferencing device, etc.

In some examples, the electronic device 102 may include or may be coupled to a printed circuit board 106. A printed circuit board may be a board made from conductive (e.g., metallic) material and non-conductive (e.g., fiberglass, laminate, composite epoxy, etc.) substrate. For instance, the printed circuit board 106 may include circuit components coupled by metallic (e.g., copper) traces.

The printed circuit board 106 may include a conductive base layer 110, an intermediate layer 112, a via 113, and an integrated circuit 104. The conductive base layer 110 may be a metallic layer (e.g., copper pour). In some examples, the conductive base layer 110 may be an electrode to produce a signal indicative of a change in an omnidirectional electrostatic field corresponding to a moving object. For instance, as an object (e.g., person) moves or interacts with an environment of the electronic device 102, the electric potential within that space may vary. The varying electric potential may be sensed by an electrode. An electrode (e.g., the conductive base layer 110) may be any conductor (e.g., aluminum, magnesium, copper, silver, tin, iron, mercury, carbon, steel, etc.). A moving object (e.g., person, door, furniture, etc.) in the environment may cause a change in electric potential in the omnidirectional electrostatic field. As electric potential in the omnidirectional electrostatic field varies, charged particles in the electrode (e.g., conductive base layer) may move, which may allow an electrical signal to be fed to the integrated circuit 104. In some examples, the omnidirectional electrostatic field detection may be passive. For instance, the printed circuit board 106 may function without creating or transmitting an electromagnetic field in some examples. For example, the printed circuit board 106 may perform detection passively without actively radiating an electromagnetic field. In some examples, the electrode (e.g., conductive base layer 110) may passively sense variations in the omnidirectional electrostatic field in the environment (e.g., surroundings) of the electronic device 102 to produce the signal. The electrostatic field (e.g., the electrostatic field variation detection) may be omnidirectional in that a variation in the electrostatic field in any direction relative to the electrode (e.g., conductive base layer 110) may be sensed.

The via 113 may be coupled to the conductive base layer 110. The via 113 may be disposed through the intermediate layer 112 of the printed circuit board 106. The intermediate layer 112 may be a substrate or dielectric layer. The via 113 may be a conductive path through the intermediate layer 112. One intermediate layer 112 is illustrated in FIG. 1. In some examples, the printed circuit board 106 may include multiple intermediate layers (e.g., dielectric layer(s) substrate(s), etc.). The via 113 may be disposed through multiple intermediate layers in some examples.

The printed circuit board 106 may include an integrated circuit 104. Examples of the integrated circuit 104 may include a logic circuit, processor, application-specific integrated circuit (ASIC), field-programmable gate array (FPGA), etc. In some examples, the integrated circuit 104 may include analog front-end circuitry, an analog-to-digital converter (ADC), filter(s), memory, processing unit, or a combination thereof. The integrated circuit 104 may be coupled to the via 113. For instance, the integrated circuit 104 may be coupled to the via 113 directly or by a conductor (e.g., wire, copper trace, etc.). In some examples, the integrated circuit 104 and the conductive base layer 110 may be connected with a connector or a cable (instead of the via 113, for instance).

In some examples, the integrated circuit 104 may include memory. The memory may be an electronic storage device, magnetic storage device, optical storage device, other physical storage device, or a combination thereof that contains or stores electronic information (e.g., instructions, data, or a combination thereof). In some examples, the memory may be, for example, Random Access Memory (RAM), Electrically Erasable Programmable Read-Only Memory (EEPROM), a storage device, an optical disc, the like, or a combination thereof. In some examples, the memory may be volatile or non-volatile memory, such as Dynamic Random Access Memory (DRAM), EEPROM, magnetoresistive random-access memory (MRAM), phase change RAM (PCRAM), memristor, flash memory, the like, or a combination thereof. In some examples, the memory may be a non-transitory tangible machine-readable or computer-readable storage medium, where the term "non-transitory" does not encompass transitory propagating signals. In some examples, the memory may include multiple devices (e.g., a RAM card and a solid-state drive (SSD)). In some examples, the memory may be integrated into the integrated circuit 104. In some examples, the memory may include (e.g., store) a machine learning model.

In some examples, the integrated circuit 104 may retrieve and execute instructions stored in the memory. The integrated circuit 104 may execute instructions stored in the memory. In some examples, the integrated circuit 104 may include electronic circuitry that includes electronic components for performing operations described herein. In some examples, the integrated circuit 104 may perform one, some, or all of the aspects, operations, elements, etc., described in one, some, or all of FIG. 1-12. In some examples, the integrated circuit 104 may be artificial intelligence circuitry. In some examples, artificial intelligence circuitry may be circuitry to perform machine learning technique(s), learning technique(s), neural network technique(s), or a combination thereof.

The integrated circuit 104 may detect, using a machine learning model, a direction of the moving object in the omnidirectional electrostatic field based on a feature of the signal. In some examples, the integrated circuit 104 may determine the feature of signal. Examples of a feature of the signal may include mean, variance, standard deviation, energy, peak-to-peak value, zero crossing, peak(s), area under a curve (e.g., integral), minimum, maximum, etc. For instance, the integrated circuit 104 may digitize the signal (e.g., raw analog signal) and calculate the feature of the signal based on the digitized signal. For instance, the feature may be a signal peak, a signal amplitude, a signal magnitude, or an area under a curve. In some examples, the feature may be calculated based on a portion (e.g., window) of the signal. For instance, the integrated circuit 104 may determine a window of the signal where the signal is greater than a magnitude. The feature may be determined within the window. In some examples, the integrated circuit 104 may determine multiple features of the signal.

Some examples of the techniques described herein may utilize machine learning. Machine learning may be a technique where a machine learning model may be trained to perform a task based on a set of examples (e.g., data). Training a machine learning model may include determining weights corresponding to structures of the machine learning model. In some examples, artificial neural networks may be a kind of machine learning model that may be structured with nodes, layers, connections, or a combination thereof.

Examples of neural networks may include convolutional neural networks (CNNs) (e.g., CNN, deconvolutional neural network, inception module, residual neural network, etc.) and recurrent neural networks (RNNs) (e.g., RNN, multilayer RNN, bi-directional RNN, fused RNN, clockwork RNN, etc.). Different neural network depths may be utilized in accordance with some examples of the techniques described herein.

In some examples, the machine learning model(s) may be trained with training data. For instance, the training data may include features (e.g., features of digitized signals) corresponding to respective directions. For instance, the training data may include ground truth features that are labeled according to direction. The machine learning model may be trained to classify a feature(s) (e.g., signal) by direction by iteratively adjusting weights of the machine learning model and evaluating a loss function. The trained machine learning model may classify a signal by direction.

In some examples, the conductive base layer 110 may be covered. For instance, the electronic device 102 may include a cover to conceal and protect the printed circuit board 106. The electrode inside of the cover may be capable of picking up electric potential variation caused by an object (e.g., person) moving or interacting with the environment. In some examples, the conductive base layer 110 may be adhered to a chassis of the electronic device 102. For instance, the conductive base layer 110 may be adhered to the chassis with conductive or non-conductive adhesive. The chassis may be conductive or non-conductive material. In some examples, the chassis may be a display housing of a laptop. For instance, the electronic device 102 may be a laptop that includes a body and a display housing (e.g., hinge up). In some examples, the printed circuit board 106 may be disposed in the display housing. In some examples, the printed circuit board 106 may communicate information (e.g., detected direction, signal data, etc.) with a host processor or host memory.

In some examples, the electronic device 102 may include a sensor. Examples of a sensor may include a motion sensor (e.g., accelerometer(s), gyroscope(s), tilt sensor(s), etc.) and an image sensor (e.g., time-of-flight (ToF) camera, optical camera, red-green-blue (RGB) sensor, web cam, millimeter wave sensor, infrared (IR) sensor, depth sensor, radar, etc., or a combination thereof). In some examples, the electronic device 102 may include multiple sensors (e.g., motion sensor and image sensor). In some examples, the integrated circuit 104 may determine whether to sample the signal (e.g., the signal indicating variation in an electrostatic field), a motion signal, or an image sensor signal based on whether the electronic device 102 is in motion (e.g., being carried, moving, etc.) or whether a person is in a zone relative to the electronic device (e.g., in front of a laptop). The signal, the motion signal, the image sensor signal, or a combination thereof may be utilized to determine an environmental scenario. An environmental scenario may be an activity or setting. Examples of an environmental scenario includes a multi-person scenario, a chassis touching scenario, a person presence scenario, an indoor scenario, an outdoor scenario, an environmental change scenario (e.g., floor change, indoor environment, outdoor environment, etc.), bag carrying scenario, gesture scenario, headset detection scenario, indoor walking scenario, outdoor walking scenario, door opening scenario, heartbeat detection scenario, or other scenario. Respective activities may create different respective electrostatic charge signatures that can be classified for detection.

In some examples, the electronic device 102 may include a motion sensor. The integrated circuit 104 may receive a motion signal (e.g., 6-axis motion data) from the motion sensor. The integrated circuit 104 may determine whether the electronic device 102 is in motion based on the motion signal from the motion sensor. For instance, the integrated circuit 104 may compare the motion signal to a motion threshold. If the motion signal (e.g., motion vector(s)) exceeds the motion threshold, the integrated circuit 104 may determine that the electronic device 102 is in motion. In some examples, the integrated circuit 104 may sample the signal (e.g., the signal indicating variation in the electrostatic field) in response to determining that the electronic device 102 is in motion.

In some examples, the electronic device 102 may include an image sensor. The integrated circuit 104 may receive an image sensor signal (e.g., pixels representing visual spectrum information, ToF information, depth information, etc.) from the image sensor. The integrated circuit 104 may determine whether a person (e.g., user) is located in a zone relative to the electronic device 102 in response to determining that the electronic device 102 is not in motion. A zone may be a directional range, a distance range, or a combination thereof from the electronic device 102. For example, a zone may be a space in front of a laptop device (e.g., ±45° from a center line of the image sensor and within 5 feet of the image sensor). In some examples, the integrated circuit 104 may determine whether a face is detected in a region of interest (corresponding to the zone) in an image from the image sensor signal, whether motion is detected in the region of interest, whether depth information indicates an object in the zone, etc. The integrated circuit 104 may sample the signal (e.g., the signal indicating variation in the electrostatic field) and the image sensor signal in response to determining that a person is in the zone. For instance, if the image sensor signal indicates that a person is in the zone (e.g., a face is detected in the zone, motion is detected in the zone, etc.), the integrated circuit 104 may sample the signal (e.g., the signal indicating variation in the electrostatic field) and the image sensor signal.

In some examples, the integrated circuit 104 may sample the signal (e.g., the signal indicating variation in the electrostatic field) in response to determining that a person is not in the zone. For instance, the integrated circuit 104 may sample the signal without sampling the image sensor signal in response to determining that a person is not in the zone.

The selected sampling (e.g., sampling of the signal, of the motion signal, of the image sensor signal, or a combination thereof) may produce sampled data. In some examples, the integrated circuit 104 may determine an environmental scenario based on sampled data from the signal. For instance, the environmental scenario may be determined based on sampled data from the signal, from the motion signal, from the image sensor signal, or a combination thereof. In some examples, the integrated circuit 104 may utilize the signal with a ToF camera. For instance, the integrated circuit 104 may utilize the ToF camera to detect a person in front of the electronic device 102, and use the information to distinguish between the person in front of the electronic device 102 from others around the electronic device 102 detected with the signal. In some examples, the integrated circuit 104 may utilize the signal and a motion sensor signal. For instance, the integrated circuit 104 may wake up the electronic device 102 when vibrations and electrostatic charge field variations are captured, indicating a person in front of the electronic device 102. In some examples, the electronic device 102 may utilize a proximity sensor such as a ToF camera. If the integrated circuit 104 detects motion from a person in front of the electronic device 102, the integrated circuit 104 may filter out electrostatic charge variation produced by the person to isolate charge variation readings from another person.

In some examples, the machine learning model or another machine learning model(s) may be trained to classify the sampled data (e.g., feature(s) from the signal, motion signal, the image sensor signal, or a combination thereof) by environmental scenario. In some examples, the machine learning model(s) may be trained using a supervised training approach. During training, for instance, a machine learning model(s) may be trained using labeled sampled data and a loss function. In some examples, the labeled sampled data may be labeled with different environmental scenarios (e.g., multi-person scenario, chassis touching scenario, person presence scenario, indoor scenario, outdoor scenario, environmental change scenario, door opening scenario, person passing quickly scenario, person passing slowly scenario, other scenario, etc.). During inferencing, the sampled data may be provided to the machine learning model(s), which may infer the environmental scenario based on the sampled data. In some examples, the machine learning model(s) (e.g., neural network(s), artificial intelligence model(s), etc.) may include thresholds for features of the sampled data. The thresholds may be utilized to determine the environmental scenario corresponding to the sampled data.

In some examples, the electronic device 102 may control an interface based on the direction of the moving object, based on environmental scenario, or based on a combination thereof. An interface is a device, an output, or a combination thereof. For instance, the electronic device 102 may include an output device (e.g., display, speaker, etc.). The electronic device 102 may control the interface based on the direction of the moving object, the environmental scenario, or a combination thereof. For instance, if the environmental scenario indicates a multi-person scenario, the electronic device 102 may reduce speaker volume, mute a speaker, lock a screen, or a combination thereof. In some examples, if the direction of the moving object indicates that a person is moving away from the electronic device 102, the electronic device 102 may lock a displayed interface, enter rest mode, or shut down. In some examples, if the direction of the moving object indicates a person (e.g., user) presence scenario and that a person is moving away from the electronic device 102, the electronic device 102 may increase a displayed text size. In some examples, the integrated circuit 104 may control the interface by sending an indicator to a host processor of the electronic device 102. For instance, the integrated circuit 104 may send the indicator via an internal bus to the host processor, and the host processor may utilize the indicator to modify interface behavior. In some examples, the integrated circuit 104 may send raw sampled data to the host processor.

In some examples, the electronic device 102 may include a communication interface(s) (not shown in FIG. 1). The electronic device 102 may utilize the communication interface(s) to communicate with an external device(s) (e.g., networked device, server, smartphone, microphone, camera, printer, computer, keyboard, mouse, etc.). In some examples, the electronic device 102 may be in communication with (e.g., coupled to, have a communication link with) a display device(s). In some examples, the electronic device 102 may include an integrated display panel, touchscreen, button, microphone, or a combination thereof.

In some examples, the communication interface may include hardware, machine-readable instructions, or a combination thereof to enable a component (e.g., integrated circuit 104, host processor, etc.) of the electronic device 102 to communicate with the external device(s). In some examples, the communication interface may enable a wired connection, wireless connection, or a combination thereof to the external device(s). In some examples, the communication interface may include a network interface card, may include hardware, may include machine-readable instructions, or may include a combination thereof to enable the electronic device 102 to communicate with an input device(s), an output device(s), or a combination thereof. Examples of output devices include a display device(s), speaker(s), headphone(s), etc. Examples of input devices include a keyboard, a mouse, a touchscreen, image sensor, microphone, etc. In some examples, a user may input instructions or data into the electronic device 102 using an input device(s).

In some examples, the communication interface(s) may include a mobile industry processor interface (MIPI), Universal Serial Bus (USB) interface, or a combination thereof. In some examples, a separate image sensor (e.g., webcam) may be utilized to capture and feed an image sensor signal to the electronic device 102 (e.g., to the integrated circuit 104). In some examples, the communication interface(s) (e.g., MIPI, USB interface, etc.) may be coupled to the integrated circuit 104. In some examples, the communication interface(s) may provide the image(s) to the integrated circuit 104 from the separate image sensor.

In some examples, the electronic device 102 may include a host processor. Some examples of the host processor may include a general-purpose processor, central processing unit (CPU), a graphics processing unit (GPU), or a combination thereof. In some examples, the host processor may be an application processor. In some examples, the host processor may perform one, some, or all of the aspects, operations, elements, etc., described in one, some, or all of FIG. 1-12. In some examples, the host processor may be coupled to the integrated circuit 104. The host processor may be separate from the integrated circuit 104 in some examples. For instance, the integrated circuit 104 may be separate circuitry or hardware from the host processor (e.g., general-purpose host processor or CPU of the electronic device 102). In some examples, the integrated circuit 104 and the host processor may be combined into one host processor.

In some examples, the printed circuit board 106 may be relatively small, and may include an electrode that can be hidden inside a chassis (without interference by other materials, for instance). In some examples, the electrostatic field may provide an omnidirectional "field of view," which may be utilized to detect people or target objects in varying directions. Some examples of the techniques described herein may operate with relatively low (e.g., <1 milliwatt (mW)) power consumption, which may be lower than that consumed by other approaches. Low power consumption may be helpful for examples where the electronic device 102 is powered by a battery. Some examples of the techniques described herein may provide motion detection with less latency (e.g., less latency than ToF motion detection). Some examples of the techniques described herein may provide environmental scenario change detection (e.g., floor type, indoor or outdoor detection, etc.).

FIG. 2 is a diagram illustrating examples of signals that may be indicative of changes in an omnidirectional electrostatic field 261 corresponding to a moving object. Some examples of the techniques described herein may sense variation of electric charges in the environment of an electronic device. In some examples, the variation of the electric charges may be utilized to detect human presence, recognizing human activities, or a combination thereof. For instance, movement of people in an area (e.g., room) near an electronic device may be detected. In some examples, an electronic device (e.g., the electronic device 102 described in FIG. 1) may measure quasi electrostatic potential changes in the environment. When a person interacts with the environment, such as walking or jumping, these actions may produce static electricity and charge the person's body with electric potential. In some examples, the static potential change may diminish within a few milliseconds, due to capacitive coupling between the human body and ground through the air, shoe, the floor, or a combination thereof. The measured signal may be utilized to detect movement. For example, an omnidirectional electrostatic field 261 may vary as a person walks by the electronic device from different directions, different speeds, or a combination thereof.

Some examples of the techniques described herein may enable directional detection in an omnidirectional electrostatic field 261. For instance, some of the techniques may enable detecting a person in front of a laptop or in other directions around the laptop. For instance, a person walking behind a laptop (e.g., direction 5 in the omnidirectional electrostatic field 261) may be detected. The directional sensitivity may be utilized for interface control in some examples. For instance, if multiple people other than a user of a laptop are detected in a room around a laptop, the laptop may automatically decrease a speaker's volume or mute. In some examples, the integrated circuit 104 described in FIG. 1 may distinguish between a person in front of the electronic device 102 and others around the electronic device, because a signal from the electrode may read differently when the detection comes from different directions. For example, a first plot 260 illustrates an example of a signal read from an electrode when a person moves behind an electronic device (e.g., direction 5 in the omnidirectional electrostatic field 261), while a second plot 259 illustrates an example of a signal read from an electrode a person moves in front of an electronic device (e.g., direction 1 in the omnidirectional electrostatic field 261). The first plot 260 and the second plot 259 are illustrated in signal magnitude (e.g., ADC sample magnitude) over time in seconds(s). In some examples, a machine learning model may be trained to classify signals corresponding to different directions (e.g., directions 1, 2, 3, 4, 5, 6, 7, and 8 in the omnidirectional electrostatic field 261). In the examples of FIG. 2, 8 directions are illustrated, separated by 45°. In some examples, more or fewer directions may be utilized (e.g., a machine learning model may be trained to classify signals for more or fewer directions).

FIG. 3 is a diagram illustrating an example of a plot of a signal 362 that may be indicative of changes in an omnidirectional electrostatic field. Some examples of the techniques described herein may be utilized to detect different environmental scenarios (e.g., different activities). The signal 362 illustrated in FIG. 3 illustrates an example of electrostatic variation when an electronic device (e.g., electronic device 102) is carried by a person. Different activities produce different patterns in the signal 362. In this example, the signal 362 exhibits different patterns when the person traverses stairs 369, when passing through a door 371, and when walking on a floor 373. In some examples of the techniques described herein, a machine learning model(s) may be trained to classify portions of a signal by different environmental scenarios, gestures (e.g., bending legs, crossing legs, extending legs, moving arms, etc.), or a combination thereof.

Figure 4:
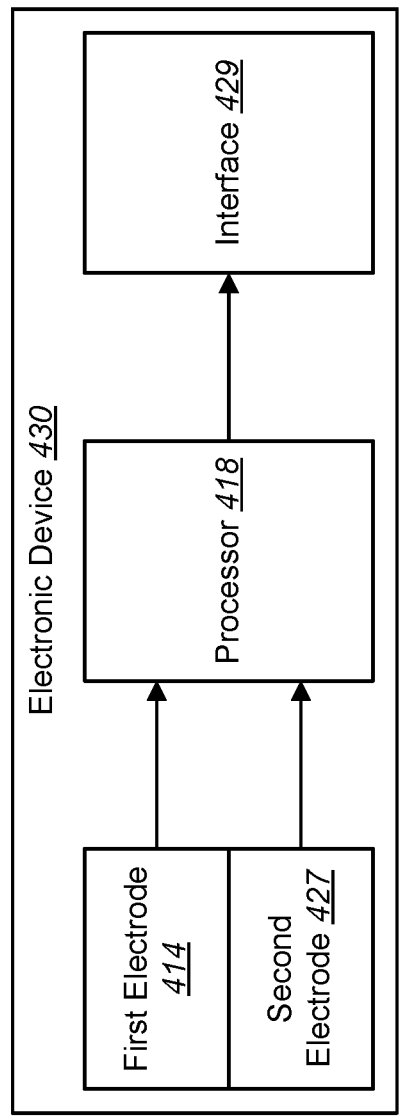
FIG. 4 is a block diagram illustrating an example of an electronic device for electrostatic detection.

FIG. 4 is a block diagram illustrating an example of an electronic device 430 for electrostatic detection. In some examples, the electronic device 430 may perform an aspect or aspects of the operations described in FIG. 1, FIG. 2, FIG. 3, or a combination thereof. The electronic device 430 may be an example of the electronic device 102 described in FIG. 1. In some examples, the electronic device 430 may include a first electrode 414, a second electrode 427, a processor 418, an interface 429, or a combination thereof. By integrating multiple electrodes into the electronic device 430, the electrostatic charge variation around the electronic device 430 (e.g., omnidirectional, spherical, or 360° field of detection) may be monitored and utilized as a sensing input to allow multiple types of detection. In some examples, one, some, or all of the components of the electronic device 430 may be structured in hardware or circuitry. In some examples, the electronic device 430 may perform one, some, or all of the operations described in FIG. 1-12.

A first electrode 414 may produce a first signal based on movement of a person in an electrostatic field. In some examples, the first electrode 414 may produce the first signal as described in FIG. 1. A second electrode 427 may produce a second signal based on the movement of the person in the electrostatic field. In some examples, the second electrode 427 may produce the second signal as described in FIG. 1. The first signal and the second signal may be provided to the processor 418. For instance, the first signal and the second signal may be provided to the processor 418 through a bus(es), wires, metallic traces, vias, etc. In some examples, the first electrode 414 and the second electrode 427 are disposed in a display housing of the electronic device 430.

In some examples, the processor 418 may be an example of the integrated circuit 104 described in FIG. 1. In some examples, the integrated circuit 104 described in FIG. 1 may be an example of the processor 418.

The processor 418 may determine a first feature of the first signal. In some examples, determining the first feature of the first signal may be performed as described in FIG. 1. For instance, the processor 418 may compute a mean, variance, standard deviation, energy, peak-to-peak value, zero crossing, peak(s), area under a curve (e.g., integral), minimum, or maximum, etc., of the first signal.

The processor 418 may determine a second feature of the second signal. In some examples, determining the second feature of the second signal may be performed as described in FIG. 1. For instance, the processor 418 may compute a mean, variance, standard deviation, energy, peak-to-peak value, zero crossing, peak(s), area under a curve (e.g., integral), minimum, or maximum, etc., of the second signal.

The processor 418 may determine a difference between the first feature and the second feature. For instance, the processor 418 may determine a subtraction of the first feature and the second feature. In some examples, the difference may indicate a phase shift (e.g., time difference between peaks or zero crossings, etc.) or an amplitude difference.

The processor 418 may determine the movement of the person based on the difference. For instance, the difference may indicate a direction of movement of the person. For example, an electrode with a higher amplitude signal may be nearer to the person and an electrode with a lower amplitude signal may be further from the person indicating a movement towards the electrode with the higher amplitude signal and away from the electrode with the lower amplitude signal. In another example, an electrode with a more recent peak may be nearer to the person and an electrode with an earlier peak may be further from the person indicating a movement towards the electrode with the more recent peak and away from the electrode with the earlier peak.

The processor 418 may control the interface 429 of the electronic device 430 based on the movement of the person. The interface 429 may be a device, output, or a combination thereof. In some examples, controlling the interface 429 may be performed as described in FIG. 1. For instance, the processor 418 may adjust speaker volume, mute a speaker, lock a display, enter rest mode, shut down, adjust text size, adjust display brightness, etc., or a combination thereof based on the movement of the person. For example, the processor 418 may lock the interface 429 in response to determining that the movement of the person is away from the electronic device 430.

Figure 5:
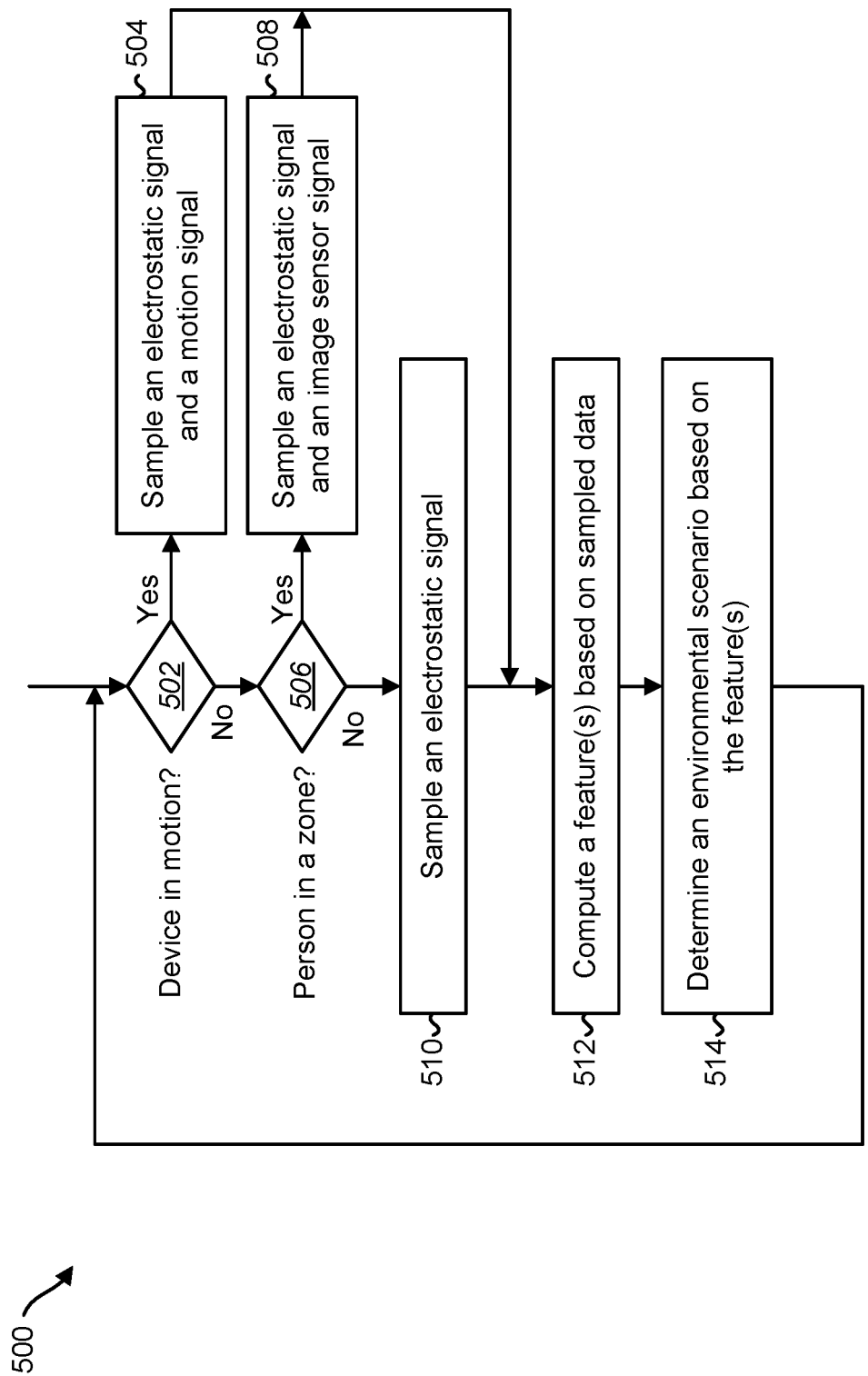
FIG. 5 is a flow diagram illustrating an example of a method for electrostatic detection.

FIG. 5 is a flow diagram illustrating an example of a method 500 for electrostatic detection. In some examples, the method 500 or a method 500 element(s) may be performed by an electronic device (e.g., electronic device 102, electronic device 430, laptop computer, smartphone, tablet device, etc.). For example, the method 500 may be performed by the electronic device 102 described in FIG. 1 or the electronic device 430 described in FIG. 4.

At 502, an electronic device may determine whether the electronic device is in motion. In some examples, determining whether the electronic device is in motion may be performed as described in FIG. 1. For instance, the electronic device may utilize a motion sensor to determine whether the electronic device is in motion. For instance, the electronic device may determine that the electronic device is not in motion in a case that a motion signal does not satisfy a motion threshold or the electronic device may determine that the electronic device is in motion in a case that a motion signal satisfies a motion threshold. At 504, the electronic device may sample an electrostatic signal and a motion signal in response to determining that the electronic device is in motion. In some examples, sampling the electrostatic signal and the motion signal may be performed as described in FIG. 1. For instance, the electronic device may sample the electrostatic signal from an electrode and the motion signal from a motion sensor to produce sampled data.

At 506, the electronic device may determine whether a person is in a zone in response to determining that the device is not in motion. In some examples, determining whether a person is in the zone may be performed as described in FIG. 1. For instance, the electronic device may utilize an image sensor to determine whether the person is in the zone. For instance, the electronic device may determine that the person is not in the zone in a case that an image does not depict a person in a region of interest or the electronic device may determine that the person is in the zone in a case that the image depicts a person in the region of interest. At 508, the electronic device may sample an electrostatic signal and an image sensor signal in response to determining that the person is in the zone. In some examples, sampling the electrostatic signal and the image sensor signal may be performed as described in FIG. 1. For instance, the electronic device may sample the electrostatic signal from an electrode and the image sensor signal from an image sensor to produce sampled data.

At 510, the electronic device may sample an electrostatic signal in response to determining that a person is not in the zone. In some examples, sampling the electrostatic signal may be performed as described in FIG. 1. For instance, the electronic device may sample the electrostatic signal from an electrode to produce sampled data.

At 512, the electronic device may compute a feature(s) based on sampled data. In some examples, computing the feature(s) based on the sampled data may be performed as described in FIG. 1. For instance, the electronic device may compute mean, variance, standard deviation, energy, peak-to-peak value, zero crossing, peak(s), area under a curve (e.g., integral), minimum, maximum, detected face location, bounding box, distance to a person, etc., or a combination thereof.

At 514, the electronic device may determine an environmental scenario based on the feature(s). In some examples, determining the environmental scenario based on the feature(s) may be performed as described in FIG. 1. For instance, the electronic device may provide the feature(s) to a trained machine learning model(s). The trained machine learning model(s) may infer (e.g., classify) the environmental scenario based on the features. For instance, the machine learning model(s) may include thresholds for mapping the features to an environmental scenario (e.g., most likely environmental scenario). In some examples, operation may return to determining whether the electronic device is in motion (for a subsequent time, for instance).

Figure 6:
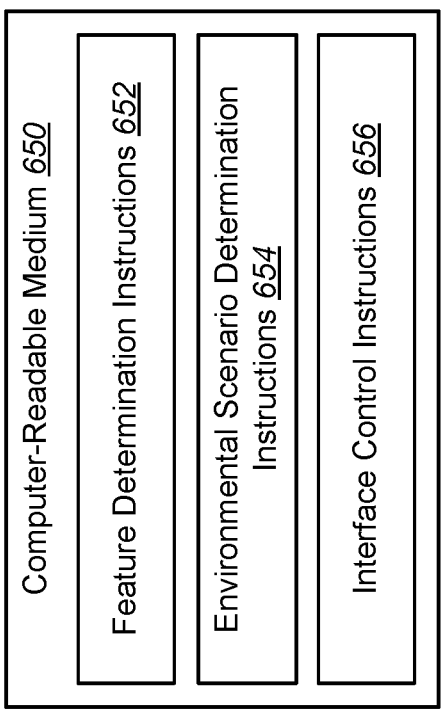
FIG. 6 is a block diagram illustrating an example of a computer-readable medium for electrostatic detection.

FIG. 6 is a block diagram illustrating an example of a computer-readable medium 650 for electrostatic detection. The computer-readable medium 650 is a non-transitory, tangible computer-readable medium. In some examples, the computer-readable medium 650 may be, for example, RAM, DRAM, EEPROM, MRAM, PCRAM, a storage device, an optical disc, the like, or a combination thereof. In some examples, the computer-readable medium 650 may be volatile memory, non-volatile memory, or a combination thereof. In some examples, the computer-readable medium 650 described in FIG. 6 may be an example of the memory described in FIG. 1.

The computer-readable medium 650 may include data (e.g., instructions, information, etc.). In some examples, the computer-readable medium 650 may include feature determination instructions 652, environmental scenario determination instructions 654, interface control instructions 656, or a combination thereof.

The feature determination instructions 652 may include instructions when executed cause a processor of an electronic device to determine a peak of a signal of an electrostatic field from an electrode. In some examples, determining a peak of a signal may be performed as described in FIG. 1. For instance, the processor may determine a maximum value of the signal within a time window of the signal.

The feature determination instructions 652 may include instructions when executed cause a processor of an electronic device to determine an area under a curve of the signal of the electrostatic field from the electrode. In some examples, determining an area under a curve of the signal may be performed as described in FIG. 1. For instance, the processor may integrate the signal within a time window of the signal.

The environmental scenario determination instructions 654 may include instructions when executed cause the processor to determine, using a machine learning model, an environmental scenario based on the peak of the signal and the area under the curve of the signal. In some examples, determining an environmental scenario may be performed as described in FIG. 1, FIG. 2, FIG. 3, FIG. 4, FIG. 5, or a combination thereof. For instance, the machine learning model may infer an environmental scenario based on the peak of the signal and the area under the curve of the signal. In some examples, the environmental scenario is a multi-user presence. In some examples, the environmental scenario is an environmental change (e.g., door opening, carried indoors, carried outdoors, traversing stairs, etc.).

The interface control instructions 656 may include instructions when executed cause the processor to control an interface of the electronic device based on the environmental scenario. In some examples, controlling the interface may be performed as described in FIG. 1, FIG. 4, or a combination thereof. For instance, the electronic device may map the environmental scenario to an interface action. In some examples, the electronic device may look up the interface action in a table and may control the interface by performing the interface action.

Figure 7:
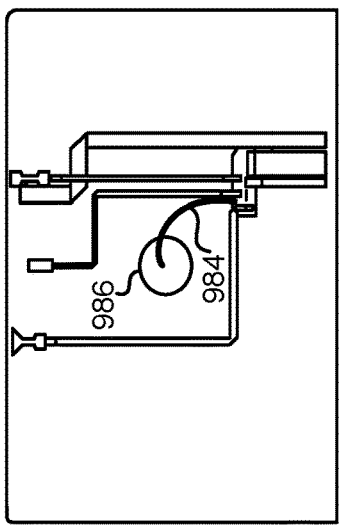
FIG. 7 is a diagram illustrating an example of a laptop computer that includes a printed circuit board.

FIG. 7 is a diagram illustrating an example of a laptop computer that includes a printed circuit board 780. Some components that are internal to a display housing of the laptop computer are illustrated. For instance, cables coupled to the printed circuit board 780 are illustrated, where the cables may be coupled to sensors (e.g., motion sensor(s), image sensor(s), etc.). In some examples, the electrode(s) described herein may be separate from touchpads. The laptop computer may be an example of the electronic device 102 described in FIG. 1. The printed circuit board 780 may be an example of the printed circuit board 106 described in FIG. 1. In this example, a conductive base layer (e.g., copper pour) of the printed circuit board 780 may act as an electrode. In some examples, the printed circuit board 780 may be adhered to a chassis of the laptop using adhesive. In some examples, a conductive base layer (e.g., exposed copper pour) of the printed circuit board 780 may act as an electrode and may electrically connect to an area where a metal chassis is exposed. For instance, the conductive base layer of the printed circuit board 780 may be adhered to exposed (e.g., masked anodized) aluminum on the chassis through a conductive adhesive. In some examples, adhesive may be disposed between the electrode and the chassis (with or without an intervening layer(s), for instance).

Figure 8:
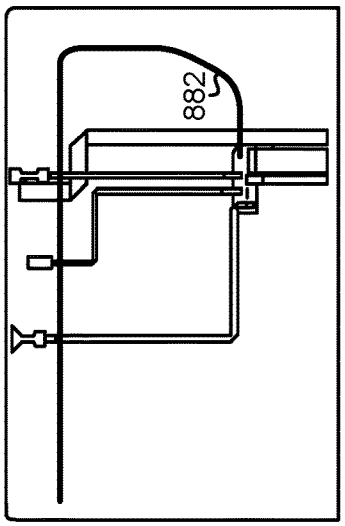
FIG. 8 is a diagram illustrating an example of a laptop computer that includes a wire electrode.

FIG. 8 is a diagram illustrating an example of a laptop computer that includes a wire electrode 882. Some components that are internal to a display housing of the laptop computer are illustrated. The laptop computer may be an example of the electronic device 102 described in FIG. 1. The wire electrode 882 may be an example of an electrode that may be utilized in accordance with some examples of the techniques described herein. For instance, a wire electrode 882 may be utilized instead of a conductive base layer of a printed circuit board. In some examples, a wire(s) running across an inside of the chassis may connect to a printed circuit board where an integrated circuit (e.g., integrated circuit 104) may be disposed.

Figure 9:
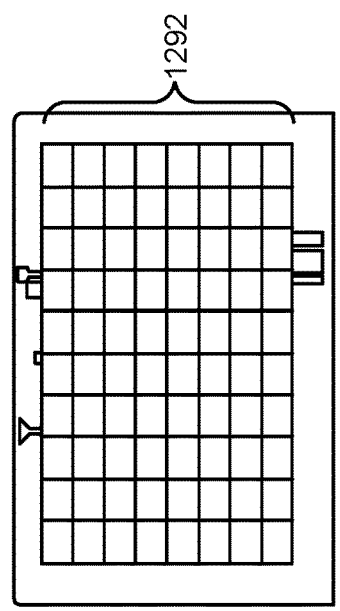
FIG. 9 is a diagram illustrating an example of a laptop computer that includes a wire connection to an exposed portion of the chassis.

FIG. 9 is a diagram illustrating an example of a laptop computer that includes a wire connection 984 to an exposed portion 986 of the chassis. Some components that are internal to a display housing of the laptop computer are illustrated. The laptop computer may be an example of the electronic device 102 described in FIG. 1. The chassis may be an example of an electrode that may be utilized in accordance with some examples of the techniques described herein. For instance, a wire connection 984 to an exposed portion 986 (e.g., masked anodization area on a chassis where an aluminum layer is exposed) may be utilized instead of a conductive base layer of a printed circuit board.

In some examples, a wire connection 984 may connect to a printed circuit board where an integrated circuit (e.g., integrated circuit 104) may be disposed.

Figure 10:
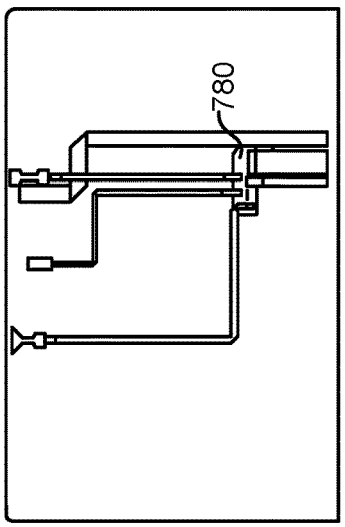
FIG. 10 is a diagram illustrating an example of a laptop computer that includes a flexible printed circuit connection to an exposed portion of the chassis.

FIG. 10 is a diagram illustrating an example of a laptop computer that includes a flexible printed circuit connection 1088 to an exposed portion 1090 of the chassis. Some components that are internal to a display housing of the laptop computer are illustrated. The laptop computer may be an example of the electronic device 102 described in FIG. 1. The chassis may be an example of an electrode that may be utilized in accordance with some examples of the techniques described herein. For instance, a flexible printed circuit connection 1088 to an exposed portion 1090 (e.g., masked anodization area on a chassis where an aluminum layer is exposed) may be utilized instead of a conductive base layer of a printed circuit board. In some examples, a flexible printed circuit connection 1088 may connect to a printed circuit board where an integrated circuit (e.g., integrated circuit 104) may be disposed.

Figure 11:
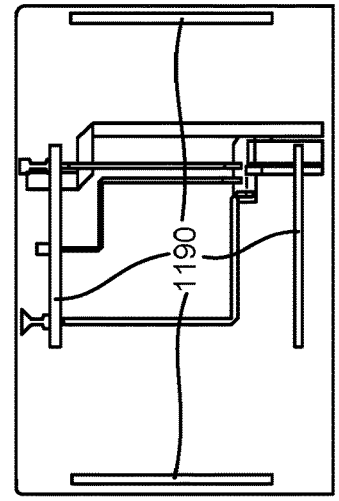
FIG. 11 is a diagram illustrating an example of a laptop computer that includes multiple electrodes.

FIG. 11 is a diagram illustrating an example of a laptop computer that includes multiple electrodes 1190. Some components that are internal to a display housing of the laptop computer are illustrated. The laptop computer may be an example of the electronic device 102 described in FIG. 1. The electrodes 1190 may include a first electrode (near the top of the chassis), a second electrode (near the left edge of the chassis), a third electrode (near a bottom of the chassis), and a fourth electrode (near a right edge of the chassis) on a same plane or similar planes. The electrodes 1190 may be utilized in accordance with some examples of the techniques described herein. For instance, the electrodes 1190 may be utilized instead of a conductive base layer of a printed circuit board. In some examples, the electrodes 1190 may be connected to a printed circuit board where an integrated circuit (e.g., integrated circuit 104) may be disposed. In some examples, multiple channels may be utilized to get signals from multiple electrodes 1190 around the chassis. The phase shift or the amplitude difference between channels may be observed to approximate angular positioning (e.g., direction of an object in an electrostatic field).

Figure 12:
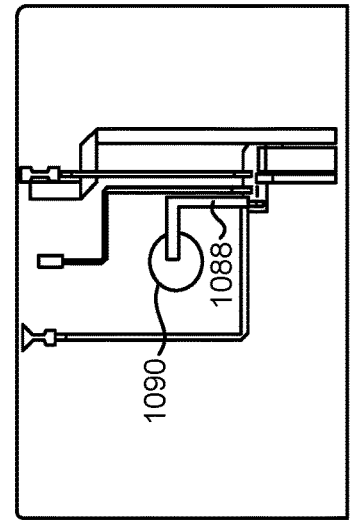
FIG. 12 is a diagram illustrating an example of a laptop computer that includes a grid of electrodes.

FIG. 12 is a diagram illustrating an example of a laptop computer that includes a grid of electrodes 1292. Some components that are internal to a display housing of the laptop computer are illustrated. The laptop computer may be an example of the electronic device 102 described in FIG. 1. The electrodes 1292 may be arranged in a grid pattern on a same plane or similar planes. The electrodes 1292 may be utilized in accordance with some examples of the techniques described herein. For instance, the grid of electrodes 1292 may be utilized instead of a conductive base layer of a printed circuit board. In some examples, the electrodes 1292 may be connected to a printed circuit board where an integrated circuit (e.g., integrated circuit 104) may be disposed. In some examples, multiple channels may be utilized to get signals from the grid of electrodes 1292 around the chassis. The phase shift or the amplitude difference between channels may be observed to approximate angular positioning (e.g., direction of an object in an electrostatic field). The grid of electrodes 1292 may provide increased resolution in detecting an object (e.g., person) in motion.

As used herein, items described with the term "or a combination thereof" may mean an item or items. For example, the phrase "A, B, C, or a combination thereof" may mean any of: A (without B and C), B (without A and C), C (without A and B), A and B (without C), B and C (without A), A and C (without B), or all of A, B, and C.

While various examples are described herein, the described techniques are not limited to the examples. Variations of the examples are within the scope of the disclosure. For example, operation(s), aspect(s), or element(s) of the examples described herein may be omitted or combined.

What is claimed is:

1. An electronic device, comprising:
    a printed circuit board, the printed circuit board comprising:
        a conductive base layer, wherein the conductive base layer is an electrode to produce a signal indicative of a change in an omnidirectional electrostatic field corresponding to a moving object;
        a via coupled to the conductive base layer, wherein the via is disposed through an intermediate layer of the printed circuit board; and
        an integrated circuit coupled to the via, wherein the integrated circuit is to detect, using an artificial neural network, a direction of the moving object in the omnidirectional electrostatic field based on a feature of the signal.

2. The electronic device of claim 1, wherein the integrated circuit is to determine the feature of the signal.

3. The electronic device of claim 2, wherein the feature is a signal peak, a signal amplitude, or an area under a curve.

4. The electronic device of claim 1, wherein the conductive base layer is adhered to a chassis of the electronic device.

5. The electronic device of claim 1, further comprising a motion sensor, wherein the integrated circuit is to determine whether the electronic device is in motion based on a motion signal from the motion sensor.

6. The electronic device of claim 5, wherein the integrated circuit is to sample the signal and the motion signal in response to determining that the electronic device is in motion.

7. The electronic device of claim 5, further comprising an image sensor, wherein the integrated circuit is to determine whether a person is located in a zone relative to the electronic device in response to determining that the electronic device is not in motion, and is to sample the signal and an image sensor signal in response to determining that a person is in the zone.

8. The electronic device of claim 7, wherein the integrated circuit is to sample the signal in response to determining that a person is not in the zone.

9. The electronic device of claim 1, wherein the integrated circuit is to determine an environmental scenario based on sampled data from the signal.

10. An electronic device, comprising:
    a first electrode to produce a first signal based on movement of a person in an electrostatic field;
    a second electrode to produce a second signal based on the movement of the person in the electrostatic field; and
    a processor to:
        determine a first feature of the first signal, the first feature comprising a mean, a variance, a standard deviation, an energy, a peak-to-peak value, a zero crossing, a peak, an area under a curve, a minimum, or a maximum of the first signal;
        determine a second feature of the second signal, the second feature comprising a mean, a variance, a standard deviation, an energy, a peak-to-peak value, a zero crossing, a peak, an area under a curve, a minimum, or a maximum of the second signal;
        determine a difference between the first feature and the second feature;

determine the movement of the person based on the difference; and control an interface of the electronic device based on the movement of the person.

11. The electronic device of claim 10, wherein the first electrode and the second electrode are disposed in a display housing of the electronic device.

12. The electronic device of claim 10, wherein the processor is to lock the interface in response to determining that the movement of the person is away from the electronic device.

13. A non-transitory tangible computer-readable medium comprising instructions when executed cause a processor of an electronic device to:

determine a peak of a signal of an electrostatic field from an electrode;

determine an area under a curve of the signal of the electrostatic field from the electrode;

determine, using an artificial neural network, an environmental scenario based on the peak of the signal and the area under the curve of the signal; and control an interface of the electronic device based on the environmental scenario.

14. The non-transitory tangible computer-readable medium of claim 13, wherein the environmental scenario is a multi-user presence.

15. The non-transitory tangible computer-readable medium of claim 14, wherein the environmental scenario is an environmental change.

* * * * *